(12) United States Patent
Paik et al.

(10) Patent No.: US 10,566,371 B2
(45) Date of Patent: Feb. 18, 2020

(54) BUMP STRUCTURES FOR INTERCONNECTING FOCAL PLANE ARRAYS

(71) Applicant: Sensors Unlimited, Inc., Princeton, NJ (US)

(72) Inventors: Namwoong Paik, Lawrenceville, NJ (US); Wei Huang, Plainsborough, NJ (US)

(73) Assignee: Sensors Unlimited, Inc., Princeton, NJ (US)

( * ) Notice: Subject to any disclaimer, the term of this patent is extended or adjusted under 35 U.S.C. 154(b) by 0 days.

(21) Appl. No.: 16/126,314

(22) Filed: Sep. 10, 2018

(65) Prior Publication Data
US 2019/0006409 A1 Jan. 3, 2019

Related U.S. Application Data

(62) Division of application No. 15/289,627, filed on Oct. 10, 2016, now Pat. No. 10,096,639.

(51) Int. Cl.
*H01L 23/48* (2006.01)
*H01L 27/146* (2006.01)
*H01L 23/00* (2006.01)

(52) U.S. Cl.
CPC ........ *H01L 27/14634* (2013.01); *H01L 24/11* (2013.01); *H01L 24/13* (2013.01); *H01L 27/1469* (2013.01); *H01L 27/14605* (2013.01); *H01L 27/14636* (2013.01); *H01L 27/14643* (2013.01); *H01L 24/03* (2013.01);
(Continued)

(58) Field of Classification Search
CPC ......... H01L 21/76801–76814; H01L 45/1683; H01L 2221/10–1089; H01L 2224/05006–05093; H01L 2224/05546; H01L 21/02063; H01L 21/486; H01L 21/76897; H01L 23/481–4855; H01L 23/5226; H01L 23/5384; H01L 2225/06541–06548; H01L 21/76877–76898; H01L 23/49827
See application file for complete search history.

(56) References Cited

U.S. PATENT DOCUMENTS 5,614,765 A * 3/1997 Avanzino .......... H01L 21/76831
257/774
5,776,833 A * 7/1998 Chen .................. H01L 21/7684
257/E21.583
(Continued)

OTHER PUBLICATIONS

Extended European Search Report dated Mar. 22, 2018 issued during the prosecution of European Patent Application No. 17195798.8 (10 pages).

*Primary Examiner* — Cuong B Nguyen
(74) *Attorney, Agent, or Firm* — Locke Lord LLP; Scott D. Wofsy; Joshua L. Jones

(57) ABSTRACT

A method of forming bump structures for interconnecting components includes dry etching a layer of insulating material to create a pattern for bump structures. A seed layer is deposited on the insulating material over the pattern. The seed layer is patterned with a photo resist material. The method also includes forming bump structures over the seed layer and the photo resist material with a plating material to form bump structures in the pattern, wherein the bump structures are isolated from one another.

6 Claims, 2 Drawing Sheets

(52) U.S. Cl.
CPC ........ *H01L 24/05* (2013.01); *H01L 2224/034* (2013.01); *H01L 2224/03622* (2013.01); *H01L 2224/03912* (2013.01); *H01L 2224/05571* (2013.01); *H01L 2224/10145* (2013.01); *H01L 2224/119* (2013.01); *H01L 2224/1145* (2013.01); *H01L 2224/1146* (2013.01); *H01L 2224/1147* (2013.01); *H01L 2224/1184* (2013.01); *H01L 2224/13007* (2013.01); *H01L 2224/13021* (2013.01); *H01L 2224/13022* (2013.01)

(56) References Cited

U.S. PATENT DOCUMENTS

| | | | |
|---|---|---|---|
| 6,218,281 B1 | 4/2001 | Watanabe et al. | |
| 6,956,292 B2 | 10/2005 | Fan et al. | |
| 7,520,053 B2 | 4/2009 | Kaneda et al. | |
| 7,659,632 B2 | 2/2010 | Tsao et al. | |
| 2003/0111730 A1* | 6/2003 | Takeda | H01L 21/76801 257/758 |
| 2005/0176241 A1* | 8/2005 | Ryu | H01L 21/76885 438/633 |
| 2011/0285008 A1 | 11/2011 | Nakano | |
| 2013/0341802 A1 | 12/2013 | Su et al. | |
| 2014/0264704 A1 | 9/2014 | D'souza et al. | |
| 2015/0014802 A1* | 1/2015 | Cheng | H01L 27/1462 257/432 |
| 2016/0005781 A1* | 1/2016 | Lin | H01L 27/14643 257/292 |

\* cited by examiner

BUMP STRUCTURES FOR INTERCONNECTING FOCAL PLANE ARRAYS

CROSS-REFERENCE TO RELATED APPLICATIONS

This application is a divisional of U.S. patent application Ser. No. 15/289,627 filed Oct. 10, 2016 which is incorporated by reference herein in its entirety.

BACKGROUND OF THE INVENTION

1. Field of the Invention

The present disclosure relates to interconnections, and more particularly to bump structures for electrically interconnecting components such as in interconnecting focal plane array components.

2. Description of Related Art

Fine pitch, large format focal plane arrays (FPAs), require small interconnect bumps with large height to diameter ratios and minimum lateral expansion after hybridization. The size and height to diameter ratio make the alignment difficult when interconnecting components with traditional techniques. Additionally, lateral expansion of the bumps affects the pressing process and manufacturing yield. As a result, lateral expansion limits the pitch size.

The conventional techniques have been considered satisfactory for their intended purpose. However, there is an ever present need for improved bump structures for interconnecting components like focal plane arrays. This disclosure provides a solution for this problem.

SUMMARY OF THE INVENTION

A method of forming bump structures for interconnecting components includes dry etching a layer of insulating material to create a pattern for bump structures. A seed layer is deposited on the insulating material over the pattern. The seed layer is patterned with a photo resist material. The method also includes forming bump structures over the seed layer and the photo resist material with a plating material to form bump structures in the pattern, wherein the bump structures are isolated from one another.

The method can include removing the photo resist material after forming bump structures over the seed layer and the photo resist material. Removing the photo resist material can include leaving the bump structures seated in a seat of the seed layer, wherein the seed layer is recessed below the insulating material to provide a gap between the bump structures and the insulating material. The method can also include pressing the bump structures and laterally expanding the bump structures into the gap to keep the bump structures from electrically short circuiting with one another.

Dry etching a layer of insulating material can include patterning the initial layer of photo resist material, dry etching a dielectric layer deposited between the insulating material and the initial layer of photo resist material, and the insulating material to create the pattern for bump structures. Depositing the seed layer can include depositing the seed layer over the dielectric layer, over a wafer supporting the insulating material, and over the insulating material. The seed layer can be deposited on the wafer at a base portion of the pattern, wherein the seed layer is deposited on the dielectric layer at a surface of the pattern opposite of the base portion, and wherein the seed layer is deposited on the insulating material in sidewalls of the pattern. The pattern can include holes for accommodating the bump structure, wherein forming bump structures over the seed layer and the photo resist material with a plating material includes depositing plating material only in the holes. Forming bump structures over the seed layer and the photo resist material with a plating material can include plating with a plating material including at least one of copper or indium.

A system includes a layer of insulating material with holes therein. A seed layer is seated within the holes, wherein the seed layer is recessed below a surface of the insulate material. A respective bump structure is seated in the seed layer of each hole. The bump structures can be on one of a photodiode array (PDA) or a read-out integrated circuit (ROIC), e.g., wherein the PDA and ROIC are joined together by the bump structures. The PDA and ROIC can define a plurality of pixels, wherein the plurality of pixels have a pitch size, wherein the pitch size is less than 10 μm. The bump structures can each have a diameter less than 5 um. The bump structures can each have a height to diameter ratio of greater than 1:1.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Figure 1:
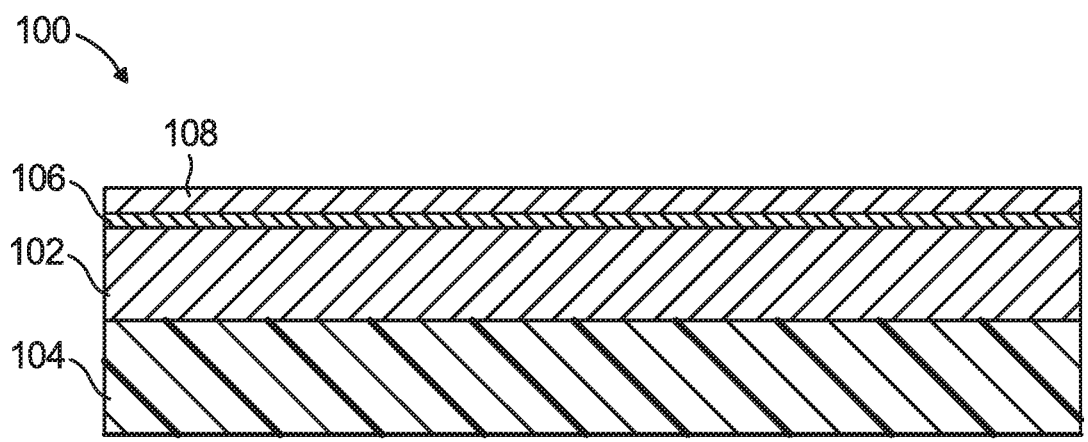
FIG. 1 is a schematic cross-sectional elevation view of an exemplary embodiment of a system constructed in accordance with the present disclosure, showing the insulating material on a wafer before etching.

Reference will now be made to the drawings wherein like reference numerals identify similar structural features or aspects of the subject disclosure. For purposes of explanation and illustration, and not limitation, a partial view of an exemplary embodiment of a system in accordance with the disclosure is shown in FIG. 1 and is designated generally by reference character 100. Other embodiments of systems in accordance with the disclosure, or aspects thereof, are provided in FIGS. 2-7, as will be described. The systems and methods described herein can be used to provide improved bump structures, e.g., to accommodate smaller pixel pitch sizes in read-out integrated circuits (ROICs), photodiode arrays (PDAs), and smaller scale interconnections in other electronic assemblies.

Figure 2:
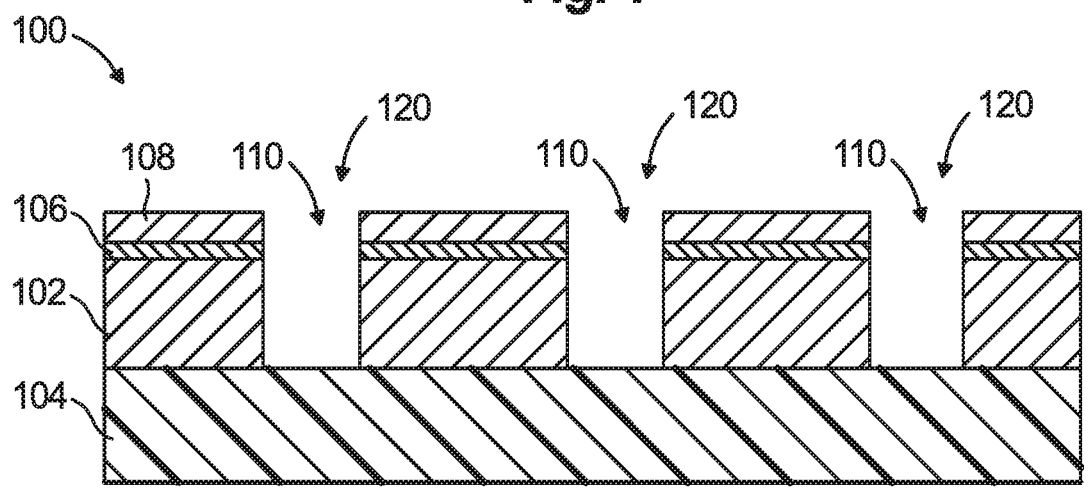
FIG. 2 is a schematic cross-sectional elevation view of the system of FIG. 1, showing the insulating material after etching the holes.

System 100 is shown in FIG. 1 including an insulating material 102, e.g. of a polyimide or other suitable material, deposited on a wafer 104. A dielectric layer 106, e.g., of SiN or other suitable material, is deposited on the insulating material 102, and an initial layer of photo resist 108 is deposited on the dielectric layer 106. This initial structure can be used in a method of forming bump structures for interconnecting components. As shown in FIG. 2, the photo resist 108 is patterned, the dielectric layer 106 and insulating layer 102 are etched, e.g., by dry etching, to form holes 110 in the insulating material 102. The holes 110 provide a pattern 120 for bump structures 116 shown in FIG. 6. Dry etching the layer of insulating material 102 includes dry etching the dielectric layer 106.

Figure 3:
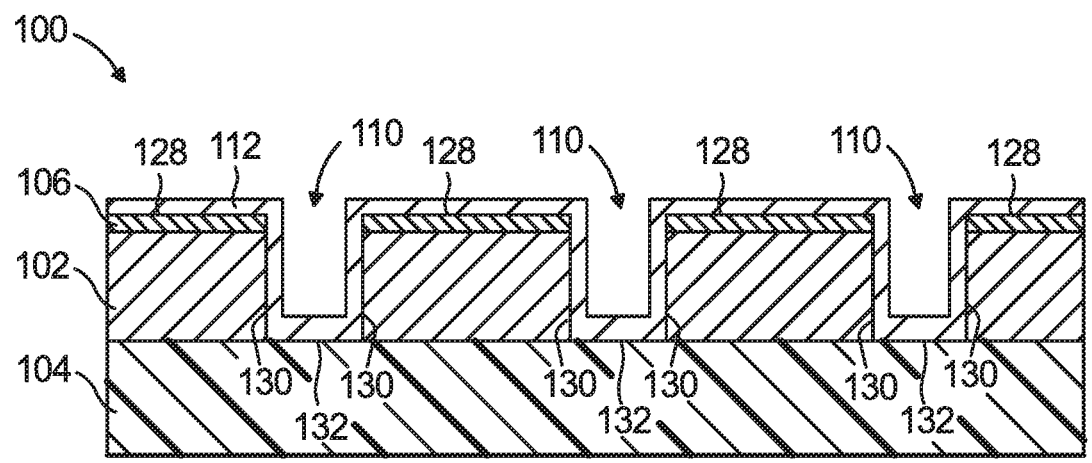
FIG. 3 is a schematic cross-sectional elevation view of the system of FIG. 1, showing the seed layer deposited over the insulating material and holes.
Figure 4:
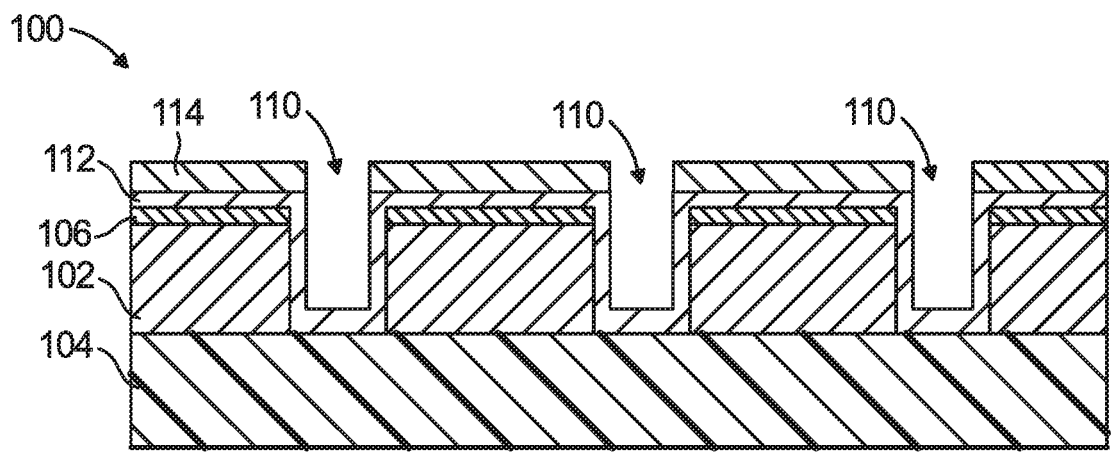
FIG. 4 is a schematic cross-sectional elevation view of the system of FIG. 1, showing the photo resist patterned on the seed layer.

The initial photo resist 108 is removed, and as shown in FIG. 3, a seed layer 112 is deposited on the insulating material 102 over the pattern, e.g., over the dielectric layer 106 and holes 110 in the insulating material 102. The seed layer 112 is deposited on the surface of the dielectric layer 106, e.g., on the top surface 128 of the hole pattern 120 of FIG. 2, on the sidewalls 130 of the holes 110, e.g., in direct contact with the insulating material 102, and on the bottom surface 132 of the holes 110 or base portion 126 of the pattern, e.g., in direct contact with the wafer 104. As shown in FIG. 4, the seed layer 112 is patterned with a second application of photo resist material 114. Seed layer 112 has the properties that allow for plating bump structures onto system 100 as explained below with reference to FIGS. 5-6.

Figure 5:
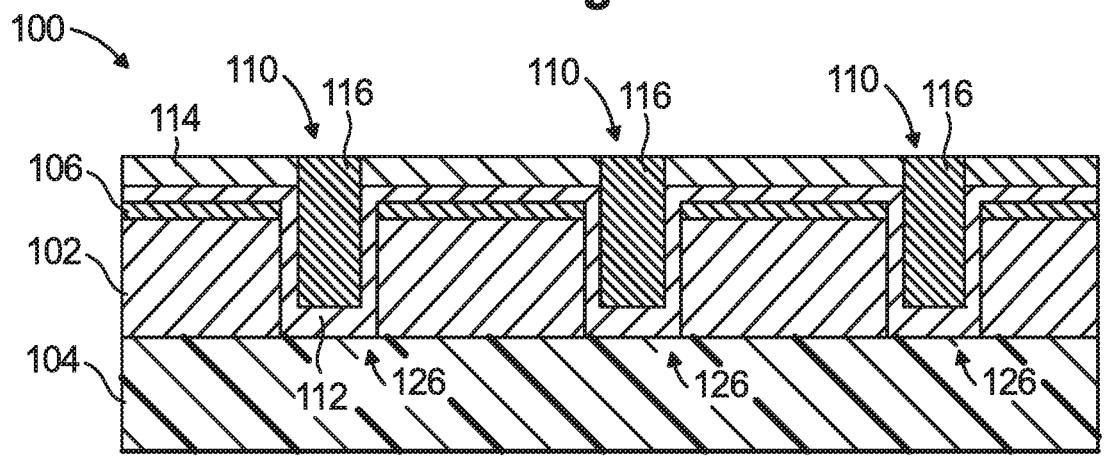
FIG. 5 is a schematic cross-sectional elevation view of the system of FIG. 1, showing the plating material plated into the holes.

With reference now to FIG. 5, with the photo resist material 114 patterned on seed layer 112, a plating material is plated over the seed layer 112 and the photo resist material 114 to form bump structures 116 in the pattern, i.e. bump structures made of the plating material in holes 110. It is contemplated that any suitable process besides plating can be used for forming the bump structures, e.g., evaporation techniques, without departing from the scope of this disclosure. The plating material is only deposited in the holes 110, so the bump structures 116 are isolated from one another electrically, and are spaced apart from one another by the insulating material 102. The plating material includes copper, indium, or any other suitable plating material, e.g., for electrical conductivity.

Figure 6:
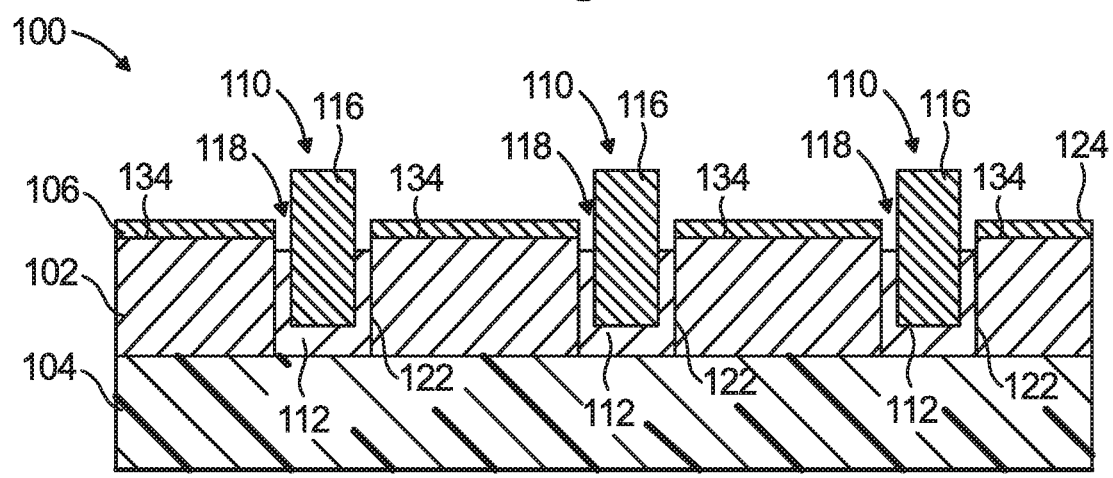
FIG. 6 is a schematic cross-sectional elevation view of the system of FIG. 1, showing the bump structures remaining after removing the photo resist material.

Referring now to FIG. 6, the method includes removing the photo resist material 114 after forming bump structures over the seed layer 112 and the photo resist material 114. Removing the photo resist material 114 can include leaving the bump structures 116 seated in a seat 122 of the seed layer 112. The remaining seed layer 112, i.e. the portions of seed layer 112 remaining in FIG. 6 from what is left after removing the portions of seed layer 112 shown in FIG. 5 but removed in FIG. 6, is recessed (as part of the removal of the photo resist material 114 of FIG. 5) below the top surface 134 of insulating material 102 (as oriented in FIG. 6, in other words the surface of insulating material 102 opposite wafer 104 and/or the bottoms surface 132 of holes 110 shown in FIG. 3), and below the surface 124 of the dielectric layer 106, to provide a gap 118 between each bump structure 116 and the insulating material 102 at the top of each hole 110. A portion of each bump structure 116 extends from the seat 122 and proud of top surface 128 of the hole pattern.

A focal plane array assembled from a PDA and ROIC as described above can define a plurality of pixels. The pixels can have a pitch size is less than 10 μm. The bump structures can each have a diameter less than 5 um. The bump structures can each have a height to diameter ratio of greater than 1:1.

The methods and systems of the present disclosure, as described above and shown in the drawings, provide for bump structures with superior properties including reduced bump size without short circuiting the bump structures in pressing. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A system comprising:
a layer of insulating material with holes therein;
a seed layer seated within the holes, wherein the seed layer is recessed below a top surface of the insulating material that is opposite a bottom surface of the holes;
a respective bump structure seated in the seed layer of each hole; and
a dielectric layer on the top surface of the insulating material, wherein the seed layer is recessed below the insulating material to provide a gap between the bump structures and the insulating material, wherein the gap between the bump structures and the insulating material is also between the dielectric layer and the bump structures, wherein dielectric layer includes SiN, wherein the bump structures stand proud above a topmost surface of the dielectric layer.

2. The system as recited in claim 1, wherein the bump structures are on one of a photodiode array (PDA) or a read-out integrated circuit (ROIC), and wherein the PDA and ROIC are joined together by the bump structures.

3. The system as recited in claim 2, wherein the PDA and ROIC define a plurality of pixels, wherein the plurality of pixels have a pitch size, wherein the pitch size is less than 10 μm.

4. The system as recited in claim 1, wherein the bump structures each have a diameter less than 5 um.

5. The system as recited in claim 1, wherein the bump structures each have a height to diameter ratio of greater than 1:1.

6. The system as recited in claim 1, wherein a portion of the bump structures extend from the seed layer proud of the top surface of the insulating material.

* * * * *